(12) United States Patent
Oh et al.

(10) Patent No.: US 8,063,453 B2
(45) Date of Patent: Nov. 22, 2011

(54) GATE IN SEMICONDUCTOR DEVICE AND METHOD OF FABRICATING THE SAME

(75) Inventors: Jae-Geun Oh, Icheon-si (KR); Jin-Ku Lee, Icheon-si (KR); Min-Ae Ju, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/318,503

(22) Filed: Dec. 30, 2008

(65) Prior Publication Data

US 2010/0084720 A1    Apr. 8, 2010

(30) Foreign Application Priority Data

Oct. 2, 2008  (KR) .................. 10-2008-0097242

(51) Int. Cl.
H01L 29/78      (2006.01)
H01L 21/425     (2006.01)
(52) U.S. Cl. ............... 257/412; 257/413; 257/E29.255; 257/E21.473; 257/E21.336; 257/E21.294; 438/530; 438/585; 438/587
(58) Field of Classification Search .......... 257/351, 257/407, 412, 413, E29.255, E21.473, E21.197, 257/E21.336, E21.294; 438/530, 585, 587
See application file for complete search history.

(56) References Cited

U.S. PATENT DOCUMENTS

| | | | |
|---|---|---|---|
| 2002/0102796 A1* | 8/2002 | Lee et al. | 438/283 |
| 2003/0122203 A1* | 7/2003 | Nishinohara et al. | 257/402 |
| 2004/0238883 A1* | 12/2004 | Nishinohara et al. | 257/330 |
| 2006/0223252 A1* | 10/2006 | Park et al. | 438/197 |
| 2008/0122005 A1* | 5/2008 | Horsky et al. | 257/369 |

FOREIGN PATENT DOCUMENTS

| | | |
|---|---|---|
| KR | 10-0267414 | 10/2000 |
| KR | 1020030001585 | 1/2003 |
| KR | 1020080088097 | 10/2008 |

OTHER PUBLICATIONS

Korean Notice of Allowance dated May 27, 2011 for 10-2008-0097242, citing the above reference(s).

* cited by examiner

Primary Examiner — Victor Mandala
Assistant Examiner — Whitney Moore
(74) Attorney, Agent, or Firm — Lowe Hauptman Ham & Berner LLP

(57) ABSTRACT

A gate of a semiconductor device includes a substrate, and a polysilicon layer over the substrate, wherein the polysilicon layer is doped with first conductive type impurities having a concentration that decreases when receding from the substrate and counter-doped with second conductive type impurities having a concentration that increases when receding from the substrate.

33 Claims, 13 Drawing Sheets

GATE IN SEMICONDUCTOR DEVICE AND METHOD OF FABRICATING THE SAME

CROSS-REFERENCE TO RELATED APPLICATIONS

The present application claims priority of Korean patent application number 10-2008-0097242, filed on Oct. 2, 2008, which is incorporated by reference herein in its entirety.

BACKGROUND

The present application relates to a semiconductor fabricating technology, and more particularly, to a gate of a semiconductor device and a fabricating method thereof.

A peripheral circuit of a DRAM employs a dual-poly gate in which a gate of an NMOS transistor is formed as N-type polysilicon and a gate of PMOS transistor is formed as P-type polysilicon. Unlike some circuits that employ N type polysilicon gates for both of NMOS and PMOS transistors, a surface channel can be formed by forming the gate of the PMOS transistor as P type polysilicon. This technology has various advantages that include reduction of short channel effect, improvement of a drain saturation current Idsat for the same threshold voltage Vt, improvement of sub threshold voltage (Sub threshold slop), and improvement of drain induced barrier lowering (DIBL). Also, the P type polysilicon gate improves a retention time and enables to fabricate a DRAM device having low power and high performance.

In case of forming a recess gate in a cell region in order to employ the dual polysilicon gate, in-situ doping is performed to uniformly sustain concentration of impurities in the recess when polysilicon is formed. Accordingly, a counter doping process is performed to convert a gate polysilicon of a PMOS transistor to P-type polysilicon by doping P-type impurity only at the gate polysilicon of the PMOS transistor after forming N type polysilicon when gates of NMOS and PMOS are formed. Therefore, it is necessary to have high dose to perform counter-doping to convert N doped polysilicon to P type polysilicon.

Some methods include fabricating the dual polysilicon gate by forming a metal electrode over the polysilicon after performing high dose counter doping for converting PMOS to P type polysilicon after forming N type polysilicon.

However, if the high dose counter doping is performed, silicon and dopants (including counter-doped dopants and in situ doped-dopants generated when the polysilicon is deposited) may be present at an interface of the polysilicon and the metal electrode at approximately the same ratio. This same ratio is because dopants are concentrated to a surface when the counter doping is performed and uniformly-doped N type impurities are also gathered to the surface due to the influence of the counter doping. Therefore, the dopants are further concentrated at the interface.

Accordingly, because the silicon is not recrystallized and the dopants do not fully function as dopant, this layer becomes a damage layer. Since such a damage layer functions as a dielectric at the interface of the polysilicon and the metal electrode, the damage layer causes signal delay.

FIG. 1 depicts a Transmission Electron Microscopy (TEM) picture illustrating polysilicon after counter doping is performed according to the related art.

As shown in FIG. 1, polysilicon is converted to amorphous silicon if counter doping is performed, and the amorphous silicon is recrystallized through a following thermal process. However, since the silicon and the dopants are present at the interface of the silicon at about the same ratio, the silicon is not recrystallized. The not-recrystallized silicon forms a damage layer and may cause a signal delay problem.

SUMMARY

Disclosed embodiments are directed to providing a semiconductor device, a gate of a semiconductor device, and a fabricating method thereof for preventing dopants from concentrating at an interface of polysilicon when counter doping is performed.

In accordance with at least one embodiment, a gate of a semiconductor device includes a substrate and a polysilicon layer over the substrate, which is doped with first conductive type impurities having a concentration decreasing when receding from the substrate and counter-doped with second conductive type impurities having a concentration increasing when receding from the substrate.

In some embodiments, the first conductive type impurities include N type impurities, and the second conductive type impurities include P type impurities.

The first conductive impurities may include P type impurities, and the second conductive type impurities may include N type impurities.

In some embodiments, first conductive type impurities has a concentration distribution of $8\times10^{20}$ atoms/cm$^3$ to $1\times10^{20}$ atoms/cm$^3$ in the polysilicon layer.

In accordance with another embodiment, a dual polysilicon gate of a semiconductor device includes: a substrate having a first region and a second region; a first polysilicon layer doped with first conductive type impurities over the first region of the substrate; and a second polysilicon layer counter-doped with first conductive type impurities having a concentration decreasing when receding from the substrate and second conductive type impurities having a concentration increasing when receding from the substrate.

In other embodiments, a method of fabricating a gate of a semiconductor device includes: forming a polysilicon layer over a substrate, the polysilicon layer being doped with first conductive type impurities having a concentration decreasing when receding from the substrate; counter doping second conductive type impurities on the polysilicon layer; and activating dopants doped in the polysilicon layer by annealing.

The first conductive type impurities may be in-situ doped.

In at least some embodiments, the first conductive type impurities have a stepped concentration distribution from a high concentration to a low concentration in the polysilicon.

In the stepped concentration distribution, an upper most layer is an un-doped region.

The first conductive type impurities may have a concentration distribution of $8\times10^{20}$ atoms/cm$^3$ to $1\times10^{20}$ atoms/cm$^3$ in the polysilicon layer.

The counter doping may be performed through Beam Line Implant or Plasma Doping.

The counter doping may be performed with a dose of $5\times10^{15}$ atoms/cm$^3$ to $5\times10^{17}$ atoms/cm$^3$.

The counter doping may be performed at energy of 0.1 keV to 10 keV.

The activation may be performed using a Rapid Thermal Process.

In accordance with another embodiment, a method of fabricating a dual polysilicon gate of a semiconductor device includes forming a first polysilicon layer over a substrate having a first region and a second region, is the first polysilicon layer being doped with first conductive type impurities having a concentration decreasing when receding from the substrate; selectively opening a first polysilicon layer of the second region; counter doping second conductive type impurities at the opened second region of the first polysilicon layer, to thereby form a second polysilicon layer; and activating dopants in the first and second polysilicon layers by annealing.

DESCRIPTION OF EMBODIMENTS

One Embodiment

Figure 1:
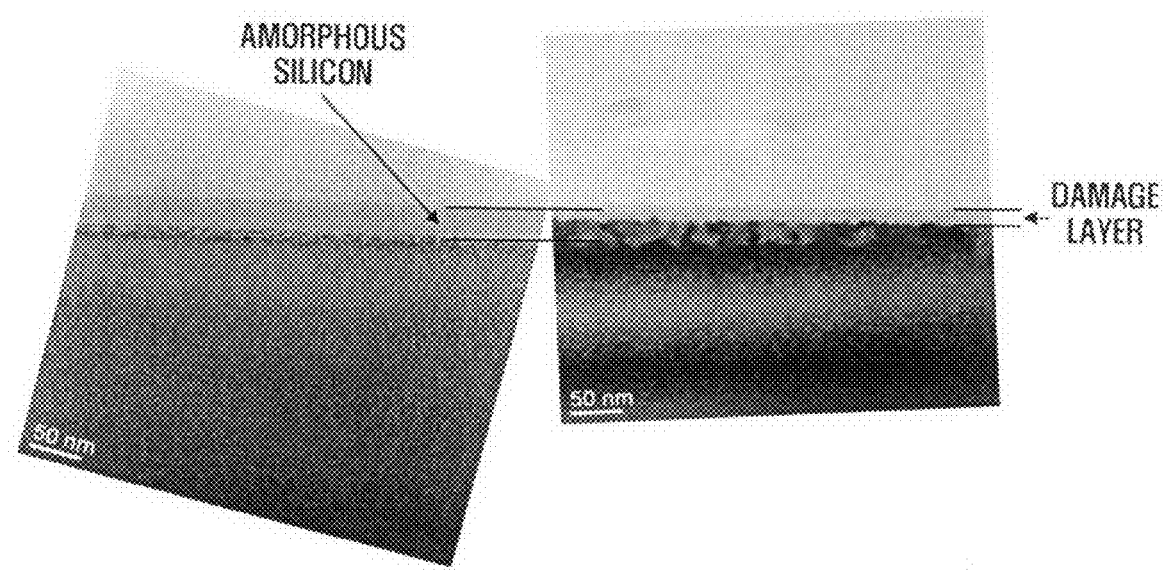
FIG. 1 depicts a Transmission Electron Microscopy (TEM) picture illustrating polysilicon after counter doping is performed according to the related art.
Figure 2:
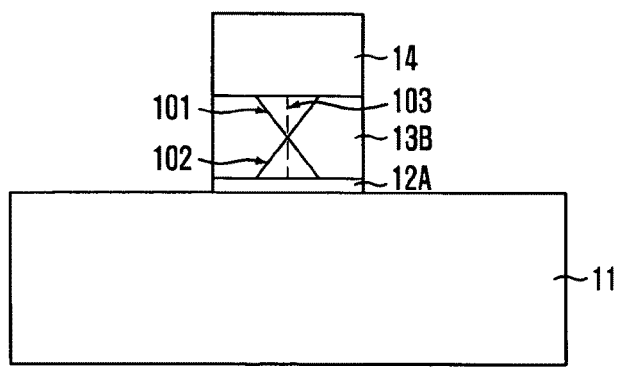
FIG. 2 is a cross-sectional view depicting a gate of a semiconductor device in accordance with one embodiment of a semiconductor device.

As shown in FIG. 2, a gate pattern including a polysilicon electrode 13B and a metal electrode 14 is formed over a substrate 11. A gate insulation layer 12A is formed between the polysilicon electrode 13B and the substrate 11 for insulating the gate pattern from the substrate 11. In some embodiments, the metal electrode 14 includes tungsten W or tungsten silicide WSi.

Particularly, the polysilicon electrode 13B is doped with first conductive impurities 101 and second conductive impurities 102 through counter doping. A concentration of the first conductive impurities 101 decreases as the first conductive impurities 101 recede from the substrate 11, and a concentration of the second conductive impurities 102 increases as the second conductive impurities 102 recede from the substrate 11. Therefore, the impurities doped in the polysilicon electrode 13B have uniform doping distribution 103.

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B.

More specifically, in some embodiments, the first conductive type impurities have concentration distribution of $8 \times 10^{20}$ atoms/cm$^3$ to $1 \times 10^{20}$ atoms/cm$^3$ in the polysilicon electrode 13B. The concentration distribution of the first conductive type impurities may have a stepped distribution from high concentration to low concentration in the polysilicon electrode 13B. The concentration distribution of the first conductive type impurities is described in detail with reference to FIGS. 5A and 5B. The concentration distribution 101 of the first conductive type impurities have the stepped distribution and in some embodiments, the upper most layer is un-doped.

The overall impurities doped in the polysilicon electrode 13B have the uniform doping distribution 103 according to the depth by doping the polysilicon electrode 13B with the first conductive type impurities having concentration decreasing as the first conductive type impurities recede from the substrate 11 and with the second conductive type impurities having concentration increasing as the second conductive type impurities recede from the substrate 11. Therefore, in some embodiments, impurities are prevented from being concentrated at a surface of the polysilicon electrode 13B.

It is also possible to prevent a damage layer, which functions as a dielectric between the polysilicon electrode 13B and the metal electrode 14, from forming because the prevention of the impurity concentration problem enables the polysilicon electrode 13B to be normally recrystallized after ion implantation. Therefore, device characteristics can be improved by preventing a signal delay problem.

Another Embodiment

Figure 3:
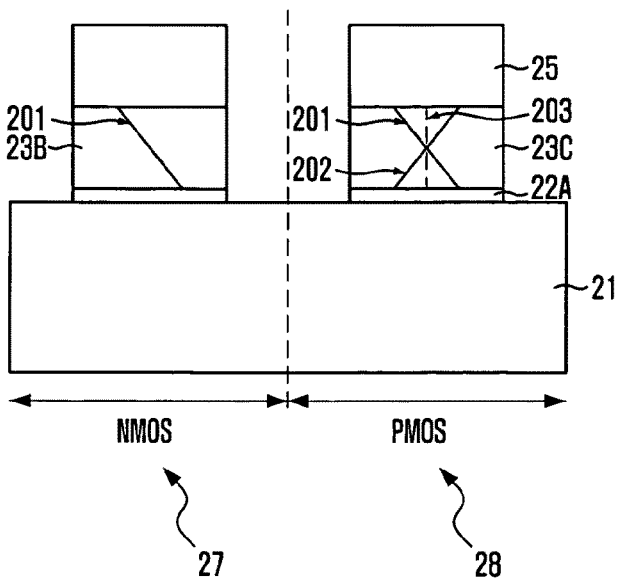
FIG. 3 is a cross-sectional view depicting a dual polysilicon gate of a semiconductor device in accordance with another embodiment.

FIG. 3 is a cross-sectional view depicting a dual polysilicon gate of a semiconductor device in accordance with the another embodiment.

As shown in FIG. 3, a gate pattern including a first polysilicon electrode 23B doped with first conductive type impurities 201 and a metal electrode 25 is formed over a first region 27 of substrate 21. Here, a concentration of the first conductive impurities 201 decreases as the first conductive impurities 201 recede from the substrate 21. A gate pattern including a second polysilicon electrode 23C and a metal electrode 25 is formed over a second region 28 of the substrate 21. Here, a concentration of the second conductive impurities 202 increases as the second conductive impurities 202 recede from the substrate 21.

A gate insulation layer 22A is formed between the first polysilicon electrode 23B and the substrate 21 and between the second polysilicon electrode 23C and the substrate 21 for insulating the gate pattern from the substrate 21. In some embodiments, the metal electrode 25 includes tungsten W or tungsten silicide WSi.

More specifically, the second polysilicon electrode 23C is doped with the first conductive impurities 201 having a concentration decreasing as the first conductive impurities 201 recede from the substrate 21. The second polysilicon electrode 23C is further doped with the second conductive impurities 202 having a concentration increasing as the second conductive impurities 202 recede from the substrate 21 through counter doping. Therefore, the overall impurities doped in the second polysilicon electrode 23C have uniform doping distribution 203.

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B.

More specifically, the first conductive type impurities have concentration distribution of $8\times10^{20}$ atoms/cm$^3$ to $1\times10^{20}$ atoms/cm$^3$ in the first and second polysilicon electrodes 23B and 23C. In some embodiments, the concentration distribution 201 of the first conductive type impurities has a stepped distribution from high concentration to low concentration in the first and second polysilicon electrodes 23B and 23C. The concentration distribution 201 of the first conductive type impurities is described in detail below with reference to FIGS. 5A and 5B. The concentration distribution 201 of the first conductive type impurities have the stepped distribution, and in some embodiments, the upper most layer is un-doped.

The overall impurities doped in the second polysilicon electrode 23C have the uniform doping distribution 203 according to the depth by counter doping the first conductive type impurities having a concentration decreasing as the first conductive type impurities recede from the substrate 21 and with the second conductive type impurities having a concentration increasing as the second conductive type impurities recede from the substrate 21. Therefore, in some embodiments, impurities are prevented from being concentrated at a surface of the second polysilicon electrode 23C.

Preventing the impurity concentration problem enables the second polysilicon electrode 23C to be normally recrystallized after ion implantation. Therefore, a damage layer that functions as a dielectric between the second polysilicon electrode 23C and the metal electrode 25, can be prevented from forming, thereby improving device characteristics by preventing a signal delay problem.

Yet Another Embodiment

Figure 4:
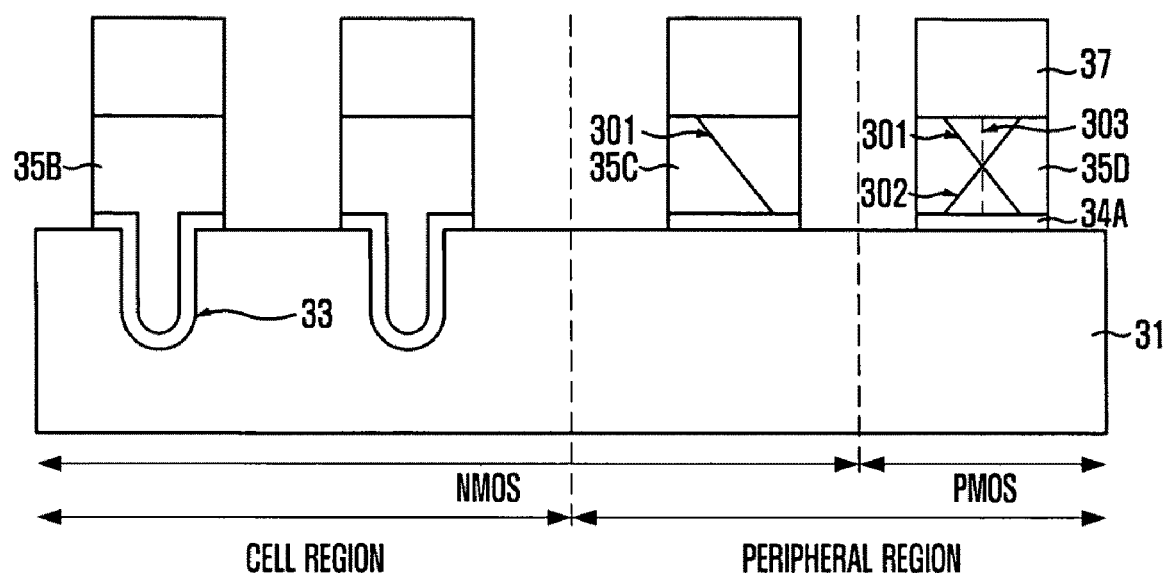
FIG. 4 is a cross-sectional view depicting a dual polysilicon gate of a semiconductor device in accordance with yet another embodiment.

FIG. 4 is a cross-sectional view for describing a dual polysilicon gate of a semiconductor device in accordance with the yet another embodiment.

As shown in FIG. 4, a recess pattern 33 is formed in a cell region of a substrate 31 includes NMOS and PMOS. The substrate 31 includes the cell region and a peripheral region. The cell region may be formed of NMOS, and the peripheral region may be formed of NMOS and PMOS. The recess pattern 33 increases a channel length for improving refresh property. Although a U type recess pattern is shown in FIG. 4, in some embodiments, recess pattern 33 includes a bulb type recess pattern and a polygonal recess pattern.

The recess pattern 33 in the cell region is then filled and gate pattern 35B is formed. A gate pattern in NMOS of the peripheral region, including: 1) a first polysilicon electrode 35C doped with a first conductive type impurity 301 having a concentration decreasing as receding from the substrate 31, and 2) a metal electrode 37, is formed over the NMOS of the substrate 31. Another gate pattern, including: 1) a second polysilicon electrode 35D counter-doped with a first conductive type impurity 301 having a concentration decreasing as receding from the substrate 31 and with second conductive type impurities 302 having a concentration increasing as receding from the substrate 31; and 2) the metal electrode 37 is formed over the PMOS of the substrate 31.

A gate insulation layer 34A is formed between the first polysilicon electrode 35C and the substrate 31 and between the second polysilicon electrode 35D and the substrate 31 for insulating the gate pattern from the substrate 31. In some embodiments, metal electrode 37 includes tungsten W or tungsten silicide WSi.

More specifically, the second polysilicon electrode 35D is doped with first conductive impurities 301 having a concentration decreasing as the first conductive impurities 301 recede from the substrate 31, and with second conductive impurities 302 having a concentration increasing as the second conductive impurities 302 recede from the substrate 31 through counter doping. Therefore, the overall impurities doped in the second polysilicon electrode 35D have uniform doping distribution 303.

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B.

The first conductive type impurities have concentration distribution of $8\times10^{20}$ atoms/cm$^3$ to $1\times10^{20}$ atoms/cm$^3$ in the first and second polysilicon electrodes 35C and 35D. In some embodiments, the concentration distribution 301 of the first conductive type impurities have stepped distribution from high concentration to low concentration in the first and second polysilicon electrodes 35C and 35D. The concentration distribution 301 of the first conductive type impurities is described in detail with reference to FIGS. 5A and 5B. In some embodiments, the concentration distribution 301 of the first conductive type impurities have the stepped distribution and the upper most layer is, in some embodiments, un-doped.

The overall impurities doped in the second polysilicon electrode 35D have the uniform doping distribution 303 according to the depth by counter doping the first conductive type impurities having a concentration decreasing as the first conductive type impurities recede from the substrate 31 and with the second conductive type impurities having a concentration increasing as the second conductive type impurities recede from the substrate 31. Therefore, in some embodiments, impurities are prevented from concentrating at a surface of the second polysilicon electrode 35D.

It is also possible to prevent a damage layer, which functions as a dielectric between the second polysilicon electrode 35D and the metal electrode 37, from forming because the prevention of the impurity concentration problem enables the second polysilicon electrode 35D to be normally recrystallized after ion implantation. Therefore, by preventing a signal delay problem, device characteristics can be improved.

Figure 5A:
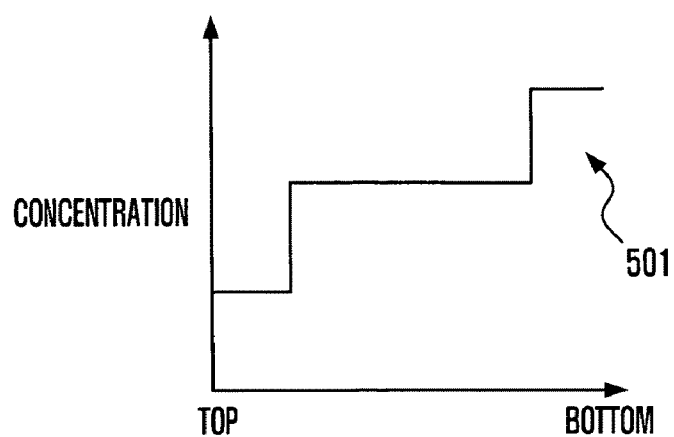
FIGS. 5A and 5B are graphs depicting concentration distribution of a first conductive type impurity according to a depth in a polysilicon layer.
Figure 5B:
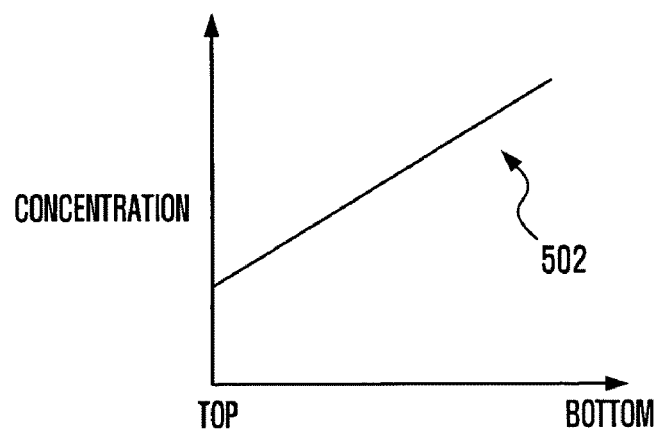

FIGS. 5A and 5B are graphs depicting concentration distribution of a first conductive type impurity according to a depth in a polysilicon layer.

As shown in FIG. 5A, the first conductive type impurities may have stepped concentration distribution 501 in a polysilicon layer. If the first conductive type impurities have three-stepped concentration distribution, a bottom part of the polysilicon layer has a first stepped high concentration distribution, a top part of the polysilicon layer has a third stepped low concentration distribution, and the other part of the polysilicon layer has a second stepped intermediate concentration distribution. Particularly, the third stepped low concentration distribution may be un-doped.

The polysilicon layer may have more than three stepped concentration distribution. The concentration distribution gradually increases from the bottom part of the polysilicon layer to the top part of the polysilicon layer.

As shown in FIG. 5B, in some embodiments, the first conductive type impurities have an inclined concentration distribution 502 that the concentration distribution gradually increases from a top part of a polysilicon layer to a bottom part of the polysilicon layer.

In a polysilicon layer, the first conductive type impurities may have a doping concentration that decreases as the first conductive type impurities recede from a substrate.

As described above, the polysilicon layer is counter-doped with the second conductive type impurities having a doping concentration increasing as receding from the substrate after the polysilicon layer is doped with the first conductive type impurities that have a doping concentration decreases as receding from the substrate in the present embodiment. As a result, the doped impurities are uniformly distributed in the polysilicon layer. Therefore, the silicon can be smoothly recrystallized.

Figure 6:
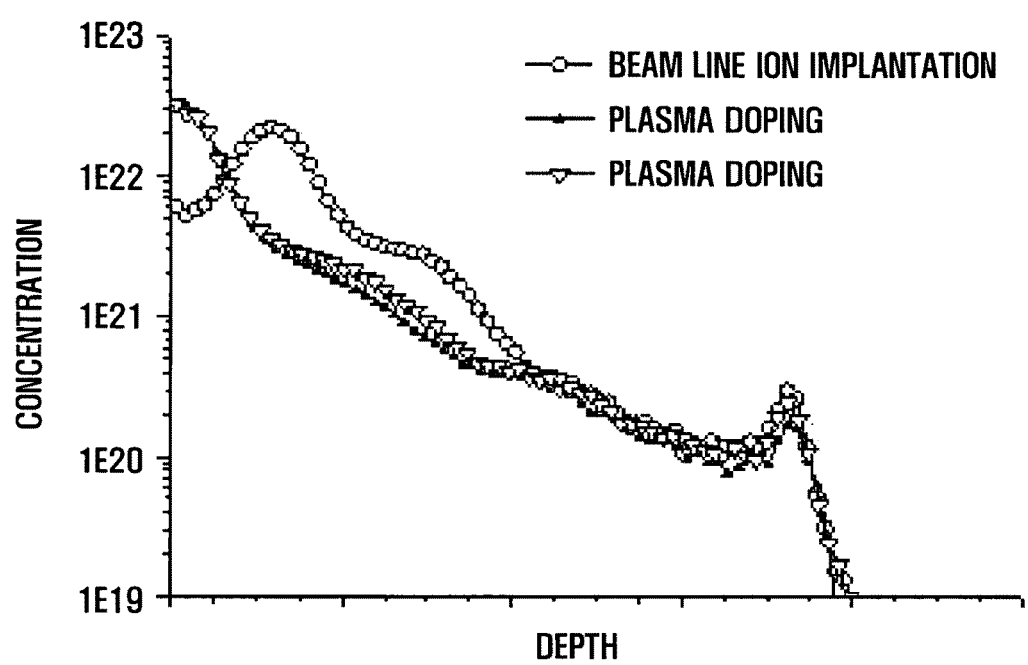
FIG. 6 is a graph depicting a concentration distribution of a second conductive type impurity according to a depth in a polysilicon layer after counter doping.

FIG. 6 is a graph depicting concentration distribution of a second conductive type impurity according to a depth in a polysilicon layer after counter doping.

As shown in FIG. 6, the graph clearly indicates that the second conductive type impurities have doping concentration increasing as receding from the substrate, that is, from a bottom part of the polysilicon layer to a top part of the polysilicon layer after counter-doping the second conductive type impurities using Beam Line Implant or Plasma doping.

Figure 7:
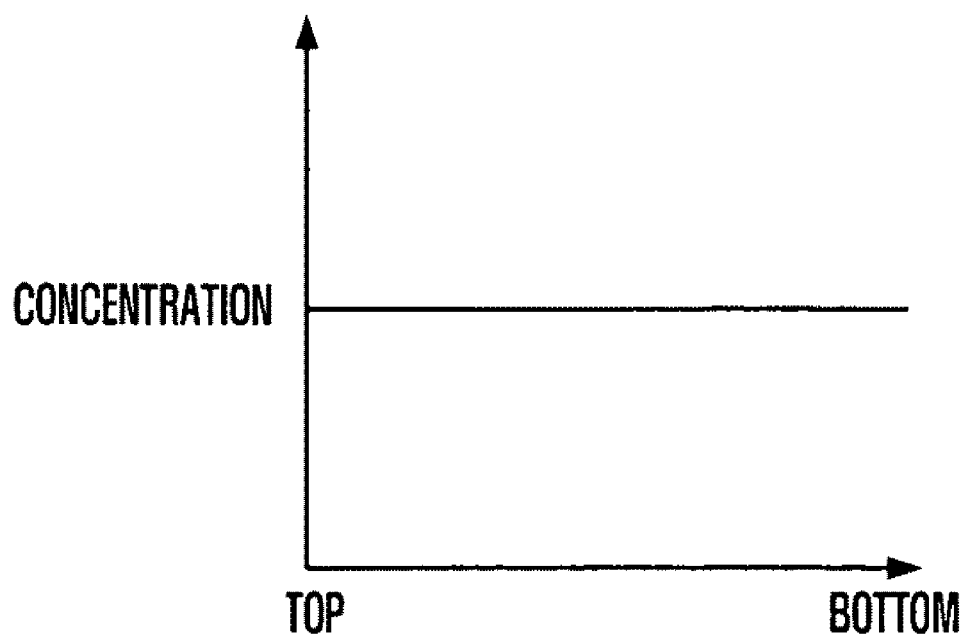
FIG. 7 is a graph depicting a concentration distribution of impurity according to a depth in a polysilicon layer, in accordance with at least one embodiment.

FIG. 7 is a graph showing concentration distribution of impurity according to a depth in a polysilicon layer in accordance with at least one embodiment of the present application.

As shown in FIG. 7, the graph clearly shows that the concentration distribution of the doped impurities is uniform in the polysilicon layer regardless of the depth if the second conductive type impurities are counter-doped in the polysilicon layer doped with the first conductive type impurities. That is, the overall concentration distribution of the doped impurities become uniform because the concentration distribution of the first conductive type impurities is opposite from that of the second conductive type impurities.

One Embodiment

FIGS. 8A to 8D are cross-sectional views depicting a method of fabricating a gate of a semiconductor device of FIG. 2.

Figure 8A:
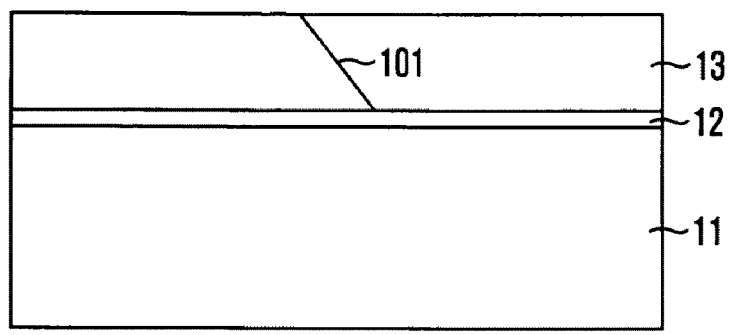
FIGS. 8A to 8D are cross-sectional views associated with a method of fabricating a gate of a semiconductor device of FIG. 2.

As shown in FIG. 8A, a gate insulation layer 12 is formed over a substrate 11. The gate insulation layer 12 may be formed as an oxide layer for insulating the substrate 11 from a gate pattern. The oxide layer may include a thermal oxide layer or a plasma oxide layer.

Then, a polysilicon layer 13, which is doped with first conductive type impurities 101 having a concentration decreasing as receding from the substrate 11, is formed over the gate insulation layer 12. The first conductive type impurities may be doped through in-situ when the first polysilicon layer 13 is formed. The first conductive type impurities have a concentration distribution of $8 \times 10^{20}$ atoms/cm$^3$ to $1 \times 10^{20}$ atoms/cm$^3$ in the polysilicon layer 13. As shown in FIGS. 5A and 5B, the concentration distribution 101 of the first conductive type impurities may be an inclined distribution or a stepped distribution that decreases from high concentration to low concentration. The upper most layer may be un-doped in the concentration distribution 101 of the first conductive type impurities.

Figure 8B:
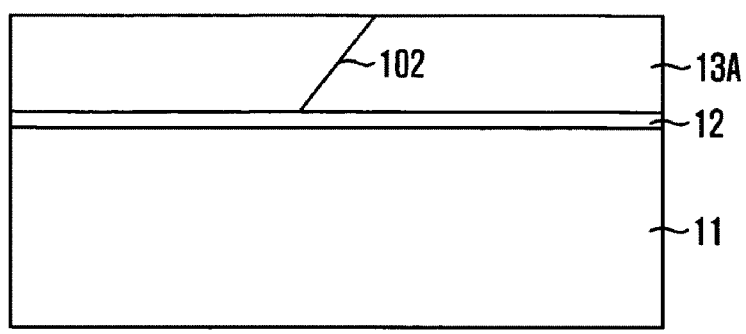

As shown in FIG. 8B, the second conductive type impurities are counter-doped in the polysilicon layer 13A.

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B.

In some embodiments, a source gas of phosphorus P includes PH$_3$, and a source gas of the arsenic As may contain AsH$_3$. A source gas of boron B may include BF$_3$ or B$_2$H$_6$.

The counter doping is performed through Beam Line Implant or Plasma Doping. The counter doping may be performed with dose of $5 \times 10^{15}$ atoms/cm$^3$ to $5 \times 10^{17}$ atoms/cm$^3$ and energy of 0.1 keV to 10 keV.

The counter doping makes the first conductive type impurities to be doped with a doping concentration 102 increasing when receding from the substrate 11. The plasma doping may further improve the increasing type doping concentration 102.

Figure 8C:
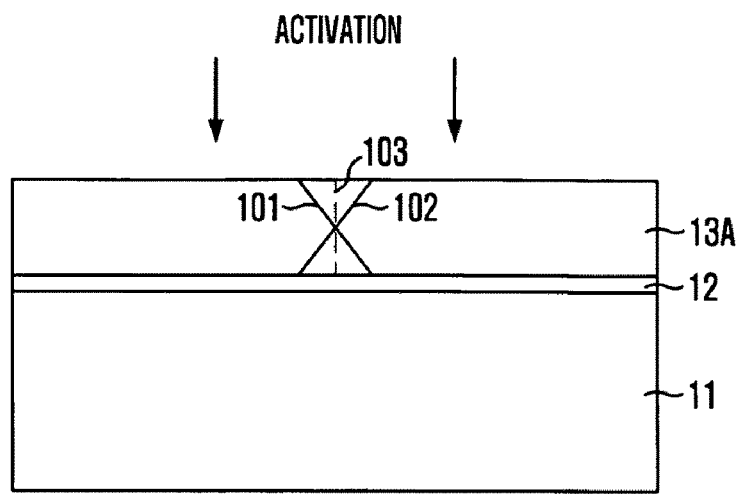

As shown in FIG. 8C, an activation annealing is performed on the polysilicon layer 13A. The activation annealing is performed for activating dopants doped in the polysilicon layer 13A. The activation annealing is performed by a rapid thermal process. The rapid thermal process is performed at a temperature of about 850° C. to 1000° C. for about 1 second to 60 seconds.

When the activation annealing is performed, the polysilicon layer 13A, which becomes amorphous by ion implantation, is recrystallized as well as activating the doped dopants. Since the first conductive type impurities are doped to have a doping concentration that decreases as receding from the substrate 11 in FIG. 8A, entire doped impurities are uniformly distributed in the polysilicon layer 13A according to the depth thereof although the counter doping is performed for concentrating the dopants at the surface of the polysilicon layer 13A in FIG. 8B. Therefore, it is possible to prevent impurities from being concentrated at the surface of the polysilicon layer 13A.

It is also possible to prevent a damage layer, which is un-recrystallized remaining after ion implantation, from forming because the prevention of the impurity concentration problem enables the polysilicon electrode layer 13A to be normally recrystallized after ion implantation. Therefore, device characteristics can be improved by preventing a signal delay problem.

Figure 8D:
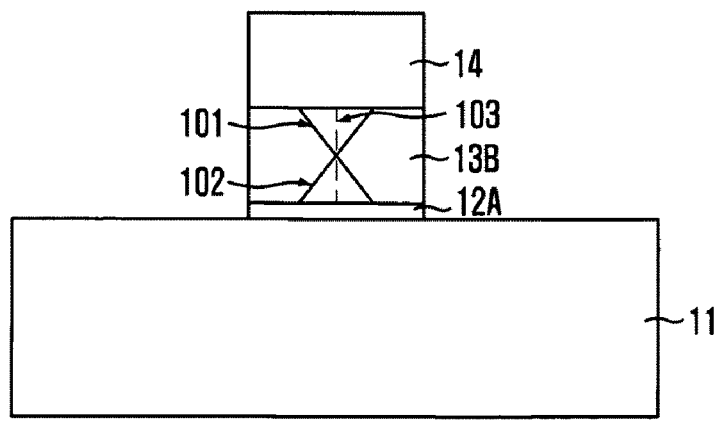

As shown in FIG. 8D, a gate pattern having a polysilicon electrode 13B, and a metal electrode 14 is formed through patterning a metal layer formed over the polysilicon layer 13A. The metal layer may include tungsten W or tungsten silicide WSi.

Another Embodiment

FIGS. 9A to 9D are cross-sectional views depicting a method of fabricating a gate of a semiconductor device according to FIG. 3.

Figure 9A:
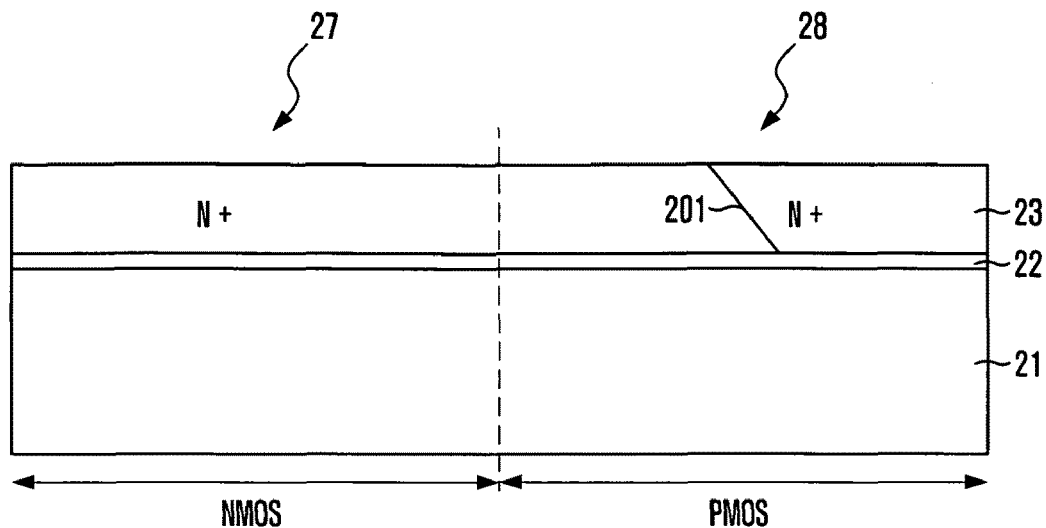
FIGS. 9A to 9D are cross-sectional views associated with a method of fabricating a gate of a semiconductor device of FIG. 3.

As shown in FIG. 9A, a gate insulation layer 22 is formed over a substrate 21. The substrate 21 may be a semiconductor substrate where a DRAM process is performed. In some embodiments, the substrate 21 includes a device isolation layer and a well. The substrate 21 may include a first region 27 and a second region 28.

The gate insulation layer 22 may be formed as an oxide layer for insulating the substrate 21 from a gate pattern. The oxide layer may include a thermal oxide layer or a plasma oxide layer.

A first polysilicon layer 23, which is doped with first conductive type impurities 201 having a concentration decreasing as receding from the substrate 21, is then formed over the gate insulation layer 22. The first conductive type impurities may be doped in-situ when the first polysilicon layer 23 is formed. In some embodiments, the first conductive type impurities have a concentration distribution of $8 \times 10^{20}$ atoms/cm$^3 \sim 1 \times 10^{20}$ atoms/cm$^3$ in the polysilicon layer 23. As shown in FIGS. 5A and 5B, the concentration distribution 201 of the first conductive type impurities may be an inclined distribution or a stepped distribution that decreases from high concentration to low concentration. The upper most layer may be un-doped in the concentration distribution 101 of the first conductive type impurities.

Figure 9B:
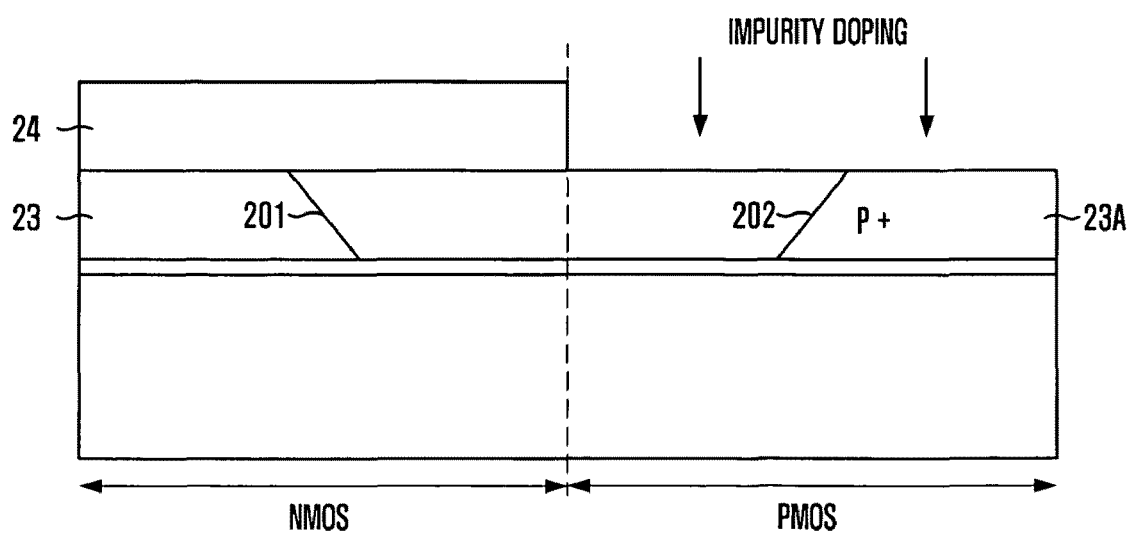

As shown in FIG. 9B, a mask pattern 24 is formed over the first polysilicon layer 23 to open an ion implantation region. The second region 28 is described below as an ion implantation region in the another embodiment of the semiconductor device.

In one embodiment, mask pattern 24 is formed by coating a photoresist layer on the first polysilicon layer 23 and performing patterning to open the second region through exposure and develop.

Using the mask pattern 24 as an ion implantation barrier, a second polysilicon layer 23A is formed by counter-doping second conductive type impurities at the second region 28 of the first polysilicon layer 23 (see FIG. 9A).

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B.

In some embodiments, a source gas of phosphorus P includes $PH_3$, and a source gas of the arsenic As contains $AsH_3$. A source gas of boron B may include $BF_3$ or $B_2H_6$.

The counter doping is performed through Beam Line Implant or Plasma Doping. The counter doping may be performed with a dose of $5\times10^{15}$ atoms/cm$^3$ to $5\times10^{17}$ atoms/cm$^3$ and energy of 0.1 keV to 10 keV.

The counter doping makes the second conductive type impurities to be doped with a doping concentration 202, increasing when receding from the substrate 21. The plasma doping may further improve the increasing type doping concentration 202.

Figure 9C:
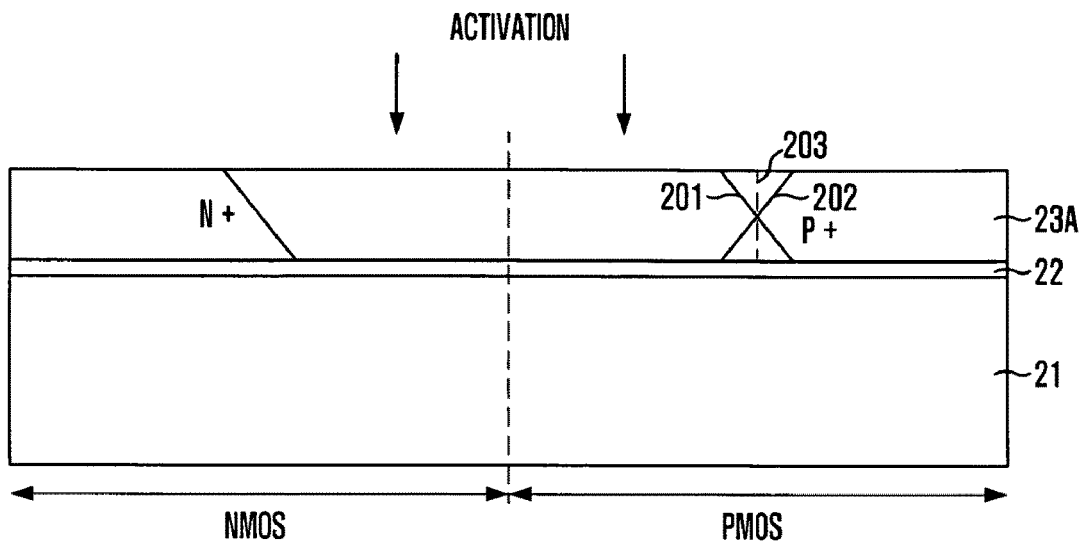

As shown in FIG. 9C, the mask pattern 24 is removed. If the mask pattern 24 is a photoresist layer, dry etching is performed. In some embodiments, the dry etching may be performed using an oxygen strip process.

An activation annealing is then performed on the first and second polysilicon layers 23 and 23A. The activation annealing is performed for activating dopants doped in the first and second polysilicon layers 23 and 23A. The activation annealing is performed by a rapid thermal process at a temperature of about 850° C. to 1000° C. for about 1 second to 60 seconds.

When the activation annealing is performed, the second polysilicon layer 23A, which becomes amorphous by ion implantation, is recrystallized in addition to activating the doped dopants in the first and second polysilicon layers 23 and 23A. Although the counter doping concentrates the dopants at the surface of the second region of the second polysilicon layer 23A (see FIG. 9B), because the first conductive type impurities are doped to have a doping concentration that decreases when receding from the substrate 21 (see FIG. 9A), entire doped impurities are uniformly distributed in the second polysilicon layer 23A according to the depth thereof. Therefore, in some embodiments, impurities are prevented from concentrating at the surface of the second polysilicon layer 23A.

Furthermore, because preventing the impurity concentration problem enables the second polysilicon electrode layer 23A to be normally recrystallized after ion implantation, a damage layer, (which is un-recrystallized remaining after ion implantation), can in some embodiments, be prevented from forming. Therefore, device characteristics can be improved by preventing a signal delay problem. Since the first polysilicon layer 23 is doped with the first conductive type impurities having a doping concentration increasing as being close to the substrate 21, it does not significantly influence the device characteristics.

Figure 9D:
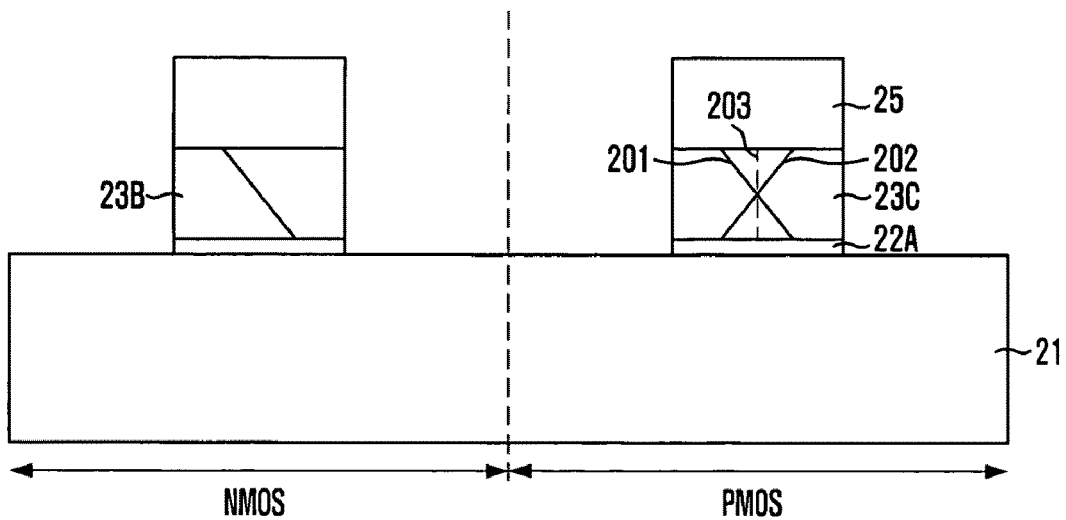

As shown in FIG. 9D, a metal layer is formed over the first and second polysilicon layers 23 and 23A (see FIG. 9C), and a gate pattern is formed through patterning. In some embodiments, the metal layer includes tungsten W or tungsten silicide WSi.

Therefore, a gate pattern having a metal electrode 25 and a first polysilicon electrode 23B doped with the first conductive type impurities having concentration that decreases when receding from substrate 21 is formed in the first region, and a gate pattern having metal electrode 25 and a second polysilicon electrode 23C counter-doped with the first conductive type impurities having concentration that decreases when receding from substrate 21 and the second conductive type impurities having concentration that increases when receding from substrate 21 is formed in the second region. Accordingly, in some embodiments, the gate pattern formed in the second region has a uniform doping distribution 203.

Yet Another Embodiment

FIGS. 10A to 10E are cross-sectional views depicting a method of fabricating a gate of a semiconductor device of FIG. 4.

A semiconductor device includes a cell region and a peripheral region (circuit region). In the cell region, a NMOS transistor is formed. In the peripheral region, a NMOS transistor and a PMOS transistor are formed. As disclosed herein, a region of the peripheral region where the NMOS transistor is formed is referred to as NMOS, and a region of the peripheral region where the PMOS transistor is formed is referred to as PMOS.

Figure 10A:
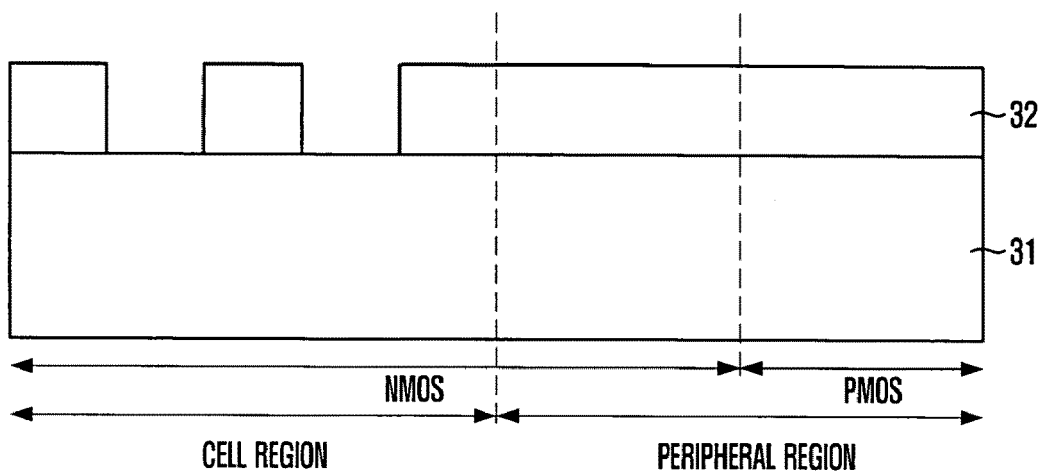
FIGS. 10A to 10E are cross-sectional views associated with a method of fabricating a gate of a semiconductor device of FIG. 4.

As shown in FIG. 10A, a first mask pattern 32 is formed over a substrate 31 to open a recess pattern forming region. The first mask pattern 32 may be formed by coating the substrate 31 with a photoresist layer and performing patterning to open a recess pattern forming region through exposure and develop. The recess pattern is formed for extending a channel length and securing refresh property. In some embodiments recess pattern forming region is formed only in a cell region.

Figure 10B:
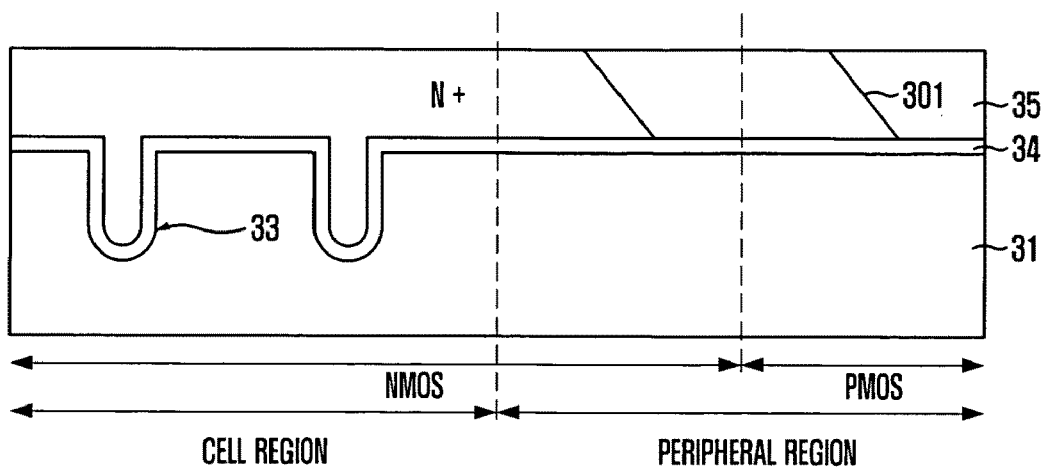

As shown in FIG. 10B, a recess pattern 33 is formed by etching the substrate 31 using the first mask pattern 32 as an etch barrier. Although a U type recess pattern is shown in the present embodiment, in some embodiments, the recess pattern 33 includes a bulb type recess pattern and a polygonal recess pattern. By forming the recess pattern 33, a gate channel length can extend, and the refresh property can be improved.

The first mask pattern 32 is then removed. If the first mask pattern 32 is a photoresist layer, dry etching may be performed. The dry etching may be performed using an oxygen strip process.

A gate insulation layer 34 is then formed over the substrate 31. The gate insulation layer 32 is for insulating the substrate 31 from a gate pattern. The gate insulation layer 32 may be formed as an oxide layer. The oxide layer may include a thermal oxide layer or a plasma oxide layer.

The recess pattern 32 on the gate insulation layer 34 is then filled, and a first polysilicon layer 35 is doped with first conductive type impurities having a concentration that decreases as receding from the substrate. The first conductive type impurities can be doped in-situ when the first polysilicon layer 35 is formed. In some embodiments, the first conductive type impurities have a concentration distribution of $8\times10^{20}$ atoms/cm$^3$ to $1\times10^{20}$ atoms/cm$^3$ in the first polysilicon layer 35. The concentration distribution of the first conductive type impurities may have an inclined concentration distribution or a stepped concentration distribution from high concentration to low concentration. In the concentration distribution 301 of the first conductive type impurities, the upper most layer is an un-doped layer.

Figure 10C:
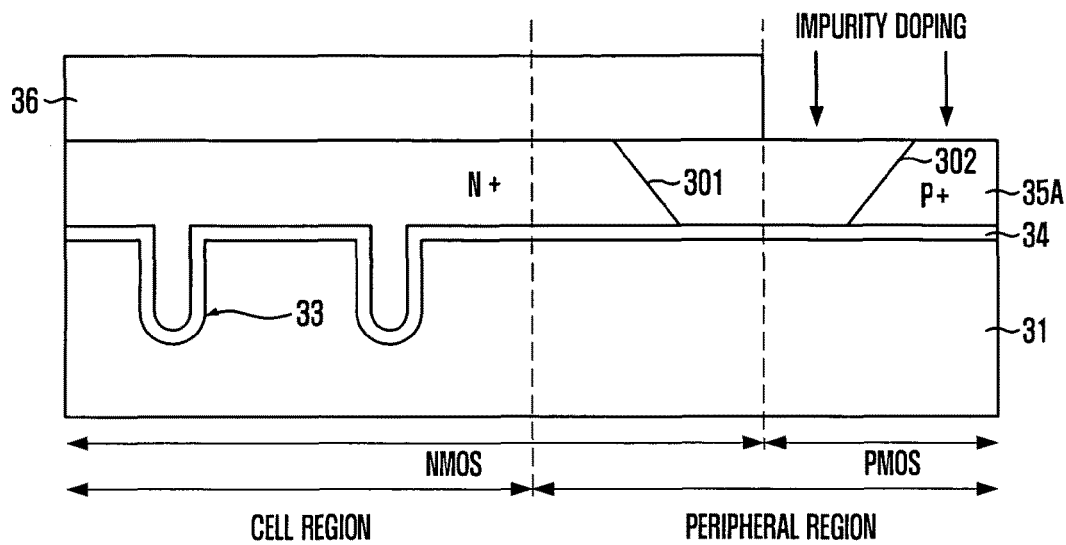

As shown in FIG. 10C, a second mask pattern 36 may be formed by coating a photoresist layer on the first polysilicon layer 35 and performing patterning to open the PMOS of the first polysilicon layer 35 through exposure and develop.

A second polysilicon layer 35A is then formed by counter-doping the second conductive type impurities in the PMOS of the first polysilicon layer 35 using the second mask pattern 36 as an ion implantation barrier.

If the first conductive type impurities include N type impurities, the second conductive type impurities include P type impurities. If the first conductive type impurities include P type impurities, the second conductive type impurities include N type impurities. Also, the N type impurities include phosphorus P or arsenic As, and the P type impurities include boron B. Also, a source gas of phosphorus P may include PH$_3$, and a source gas of the arsenic As may contain AsH$_3$. A source gas of boron B may include BF$_3$ or B$_2$H$_6$.

The counter doping is performed through Beam Line Implant or Plasma Doping. The counter doping may be performed with a dose of $5\times10^{15}$ atoms/cm$^3$ to $5\times10^{17}$ atoms/cm$^3$ and energy of 0.1 keV to 10 keV.

The counter doping provides a doping concentration 302 increasing when receding from the substrate 31. The plasma doping may further improve the increasing type doping concentration 302.

Figure 10D:
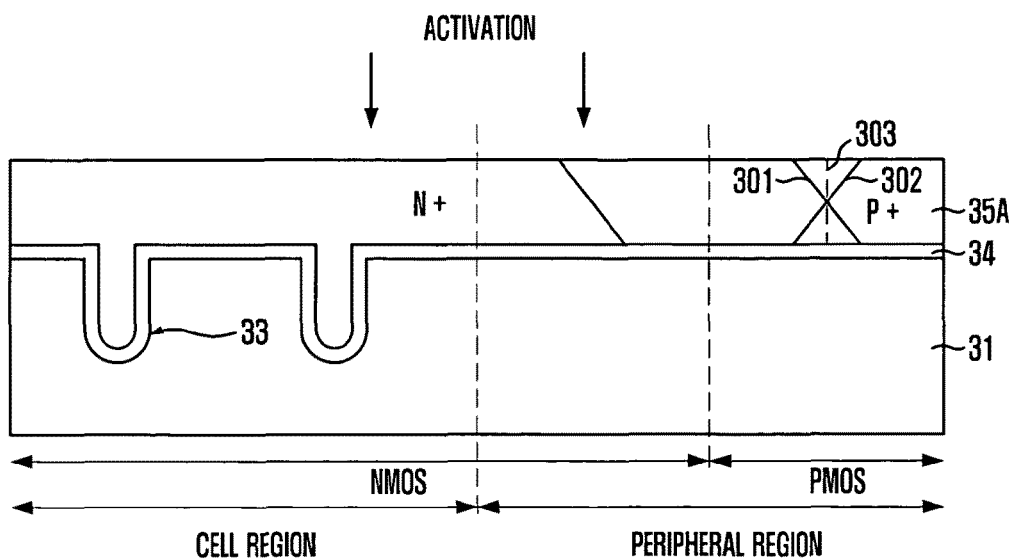

As shown in FIG. 10D, the second mask pattern 36 is removed. If the second mask pattern 36 is a photoresist layer, the second mask pattern 36 can be removed through dry etching. The dry etching may be performed as an oxygen strip process.

An activation annealing is performed on the first and second polysilicon layers 35 and 35A. The activation annealing is performed for activating dopants doped in the first and second polysilicon layers 35 and 35A. The activation annealing is performed using a rapid thermal process. The rapid thermal process is performed at a temperature of about 850° C. to 1000° C. for about 1 second to 60 seconds.

When the activation annealing is performed, the second polysilicon layer 35A, which becomes amorphous by ion implantation, is recrystallized as well as activating the doped dopants in the first and second polysilicon layers 35 and 35A. Since the first conductive type impurities are doped to have a doping concentration that decreases as receding from the substrate 31 in FIG. 10B, entire doped impurities are uniformly distributed in the second polysilicon layer 35A according to the depth thereof although the counter doping is performed for concentrating the dopants at the surface of the second polysilicon layer 35A in FIG. 10C. Therefore, it is possible to prevent impurities from being concentrated at the surface of the second polysilicon layer 35A.

In some embodiments, a damage layer, which is un-recrystallized remaining after ion implantation, is prevent from forming because the prevention of the impurity concentration problem enables the second polysilicon electrode layer 35A to be normally recrystallized after ion implantation. Therefore, device characteristics can be improved by preventing a signal delay problem.

Because the first conductive type impurities are doped in the first polysilicon layer 35 in-situ and the doping concentration of the first conductive type impurities increases as it becomes close to the substrate 31, the first conductive type impurities are sufficiently doped to the first polysilicon layer 35 in the recess pattern 33. Therefore, it does not influence to the device characteristics.

Figure 10E:
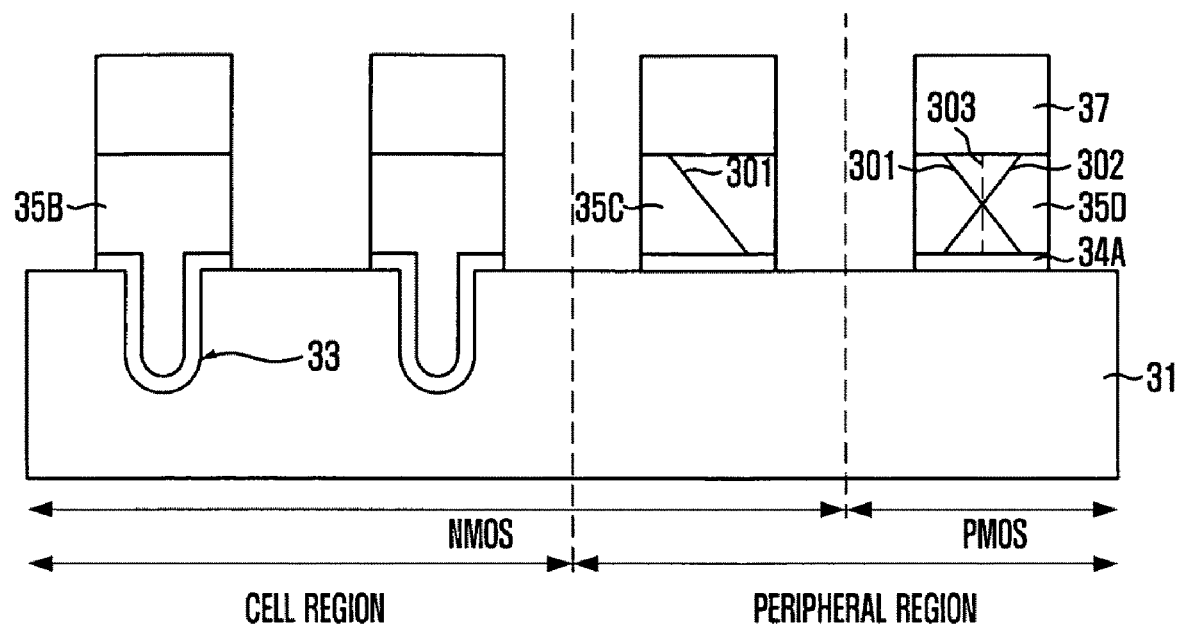

As shown in FIG. 10E, a metal layer is formed over the first and second polysilicon layers 35 and 35A (See FIG. 10D), and a gate pattern is formed through patterning. Here, the metal layer may include tungsten W or tungsten silicide Wsi.

Therefore, the recess pattern 33 of the cell region is filled, and a gate pattern having a metal electrode 37 and a first polysilicon electrode 35C doped with the first conductive type impurities having concentration that decreases as receding from the substrate 31 is formed in the NMOS of the substrate 31. In addition, a gate pattern having the metal electrode 37 and a second polysilicon electrode 35D counter-doped with the first conductive type impurities having concentration that decreases as receding from the substrate 31 and the second conductive type impurities having concentration that increases as receding from the substrate 31, is formed in the PMOS of the substrate 31. Accordingly, in some embodiments, the gate pattern formed in the PMOS of the substrate 31 has uniform doping distribution 303 therein.

Embodiments of the present application relate to a gate of a semiconductor device and a fabricating method thereof. An in-situ doped polysilicon layer is formed to have concentration of impurities increasing as the impurities are closer to a substrate and to have concentration decreasing as the impurities recedes from the substrate. Therefore, the dopants are prevented from concentrating at a surface of the polysilicon layer when counter doping is performed. Also, the concentration of dopants in the polysilicon layer is uniformly sustained according to a depth, and silicon can be re-grown entirely.

Therefore, by preventing formation of a damage layer functioning as a dielectric between the polysilicon electrode and the metal electrode, a signal delay problem may be avoided, thereby improving device characteristics.

While the present application has been described with respect to embodiments, it will be apparent to those skilled in the art that various changes and modifications may be made without departing from the spirit and scope of the application as defined in the following claims.

What is claimed is:

1. A gate of a semiconductor device comprising:
   a substrate; and
   a polysilicon layer over the substrate, which is doped with first conductive type impurities having a concentration decreasing throughout the layer when receding from the substrate and counter-doped with second conductive type impurities having a concentration increasing when receding from the substrate.

2. The gate of claim 1, wherein the first conductive type impurities include N type impurities, and the second conductive type impurities include P type impurities.

3. The gate of claim 1, wherein the first conductive impurities include P type impurities, and the second conductive type impurities include N type impurities.

4. The gate of claim 1, wherein the first conductive type impurities have a concentration distribution of $8\times10^{20}$ atoms/cm$^3$ to $1\times10^{20}$ atoms/cm$^3$ in the polysilicon layer.

5. A dual polysilicon gate of a semiconductor device, comprising:
   a substrate having a first region and a second region;

a first polysilicon layer doped with first conductive type impurities having a concentration decreasing throughout the layer when receding from the substrate, the first polysilicon layer formed over the first region of the substrate; and a second polysilicon layer doped with first conductive type impurities having a concentration decreasing throughout the layer when receding from the substrate and counter-doped with second conductive type impurities having a concentration increasing when receding from the substrate, the second polysilicon layer formed over the second region of the substrate.

6. The dual polysilicon gate of claim 5, wherein the first conductive type impurities include N type impurities if the first region is NMOS, and the second conductive type impurities include P type impurities if the second region is PMOS.

7. The dual polysilicon gate of claim 5, wherein the first conductive type impurities include P type impurities if the first region is PMOS, and the second conductive type impurities include N type impurities if the second region is NMOS.

8. The dual polysilicon gate of claim 5, wherein the first conductive type impurities have a concentration distribution of $8\times10^{20}$ atoms/cm$^3$ $1\times10^{20}$ atoms/cm$^3$ in the first and second polysilicon layers.

9. The dual polysilicon gate of claim 5, wherein one of the first and second regions is NMOS, the NMOS including a recess pattern.

10. A method of fabricating a gate of a semiconductor device, comprising:
forming a polysilicon layer over a substrate, the polysilicon layer being doped with first conductive type impurities having a concentration decreasing throughout the layer when receding from the substrate;
counter doping second conductive type impurities on the polysilicon layer doped with the first conductive type impurities; and
activating dopants doped in the polysilicon layer by annealing.

11. The method of claim 10, wherein the first conductive type impurities include N type impurities, and the second conductive type impurities include P type impurities.

12. The method of claim 10, wherein the first conductive impurities include P type impurities, and the second conductive type impurities include N type impurities.

13. The method of claim 10, wherein the first conductive type impurities are in-situ doped.

14. The method of claim 10, wherein the first conductive type impurities have a stepped concentration distribution of multiple steps based on a depth in the polysilicon, from a high concentration to a low concentration.

15. The method of claim 14, wherein in the stepped concentration distribution based on the depth, an upper most layer is an un-doped region.

16. The method of claim 10, wherein the first conductive type impurities have a concentration distribution of $8\times10^{20}$ atoms/cm$^3$ to $1\times10^{20}$ atoms/cm$^3$ in the polysilicon layer.

17. The method of claim 10, wherein the counter doping is performed through Beam Line Implant or Plasma Doping.

18. The method of claim 10, wherein the counter doping is performed with a dose of $5\times10^{15}$ atoms/cm$^3$ to $5\times10^{17}$ atoms/cm$^3$.

19. The method of claim 10, wherein the counter doping is performed at energy of 0.1 keV to 10 keV.

20. The method of claim 10, wherein activating is performed using a rapid thermal process.

21. The method of claim 10, wherein the second conductive type impurities have a concentration increasing when receding from the substrate.

22. A method of fabricating a dual polysilicon gate in a semiconductor device, comprising:
forming a first polysilicon layer over a substrate having a first region and a second region, the first polysilicon layer being doped with first conductive type impurities having a concentration decreasing throughout the layer as receding from the substrate;
selectively opening the first polysilicon layer of the second region;
counter doping second conductive type impurities at the opened second region of the first polysilicon layer, to thereby form a second polysilicon layer; and
activating dopants in the first and second polysilicon layers by annealing.

23. The method of claim 22, wherein the first conductive type impurities include N type impurities if the first region is NMOS, and the second conductive type impurities include P type impurities if the second region is PMOS.

24. The method of claim 22, wherein the first conductive type impurities include P type impurities if the first region is PMOS, and the second conductive type impurities include N type impurities if the second region is NMOS.

25. The method of claim 22, wherein the first conductive type impurities are in-situ doped.

26. The method of claim 22, wherein the first conductive type impurities have a stepped concentration distribution of multiple steps based on a depth from a high concentration to a low concentration in the first and second polysilicon layers.

27. The method of claim 26, wherein in the stepped concentration distribution based on the depth, an upper most layer is an un-doped region.

28. The method of claim 22, wherein the first conductive type impurities have a concentration distribution of $8\times10^{20}$ atoms/cm$^3$ to $1\times10^{20}$ atoms/cm$^3$ in the first and second polysilicon layers.

29. The method of claim 22, wherein the counter doping is performed through Beam Line Implant or Plasma Doping.

30. The method of claim 22, wherein the counter doping is performed with a dose of $5\times10^{15}$ atoms/cm$^3$ to $5\times10^{17}$ atoms/cm$^3$.

31. The method of claim 22, wherein the counter doping is performed at energy of 0.1 keV to 10 keV.

32. The method of claim 22, wherein the activation is performed using a rapid thermal process.

33. The method of claim 22, wherein the second conductive type impurities have a concentration increasing when receding from the substrate.

* * * * *